(12) United States Patent
Zhong

(10) Patent No.: US 11,316,085 B2
(45) Date of Patent: Apr. 26, 2022

(54) DISPLAY DEVICE AND MANUFACTURING METHOD THEREOF

(71) Applicant: KAISTAR Lighting (Xiamen) Co., Ltd., Xiamen (CN)

(72) Inventor: Bin Zhong, Xiamen (CN)

(73) Assignee: KAISTAR LIGHTING (XIAMEN) CO., LTD., Xiamen (CN)

(*) Notice: Subject to any disclaimer, the term of this patent is extended or adjusted under 35 U.S.C. 154(b) by 144 days.

(21) Appl. No.: 16/734,330

(22) Filed: Jan. 4, 2020

(65) Prior Publication Data

US 2020/0335679 A1 Oct. 22, 2020

(30) Foreign Application Priority Data

Apr. 19, 2019 (CN) .......................... 201910318255.5

(51) Int. Cl.
*H01L 23/00* (2006.01)
*H01L 33/62* (2010.01)
(Continued)

(52) U.S. Cl.
CPC .......... *H01L 33/62* (2013.01); *H01L 21/4828* (2013.01); *H01L 21/4842* (2013.01); *H01L 21/6836* (2013.01); *H01L 24/48* (2013.01); *H01L 25/0753* (2013.01); *H01L 33/56* (2013.01); *H01L 2221/68372* (2013.01); *H01L 2224/48091* (2013.01); *H01L 2224/48106* (2013.01); *H01L 2224/48247* (2013.01); *H01L 2924/12041* (2013.01); *H01L 2933/005* (2013.01); *H01L 2933/0066* (2013.01)

(58) Field of Classification Search
CPC . H01L 21/4828; H01L 21/4842; H01L 24/48; H01L 24/32; H01L 2221/68725; H01L 2224/48108; H01L 2224/48247; H01L 2224/45144; H01L 2024/12041; H01L 2933/0005; H01L 2933/0066; H01L 33/62; H01L 25/0753
See application file for complete search history.

(56) References Cited

U.S. PATENT DOCUMENTS

2009/0027895 A1* 1/2009 Daimon .................... C08L 1/18
362/311.06
2011/0215342 A1* 9/2011 Oliver .................... B29C 43/18
257/81
(Continued)

*Primary Examiner* — Caridad Everhart
(74) *Attorney, Agent, or Firm* — Hemisphere Law, PLLC; Zhigang Ma

(57) ABSTRACT

A display device and a manufacturing method thereof are provided. The display device includes a circuit substrate, multiple light-emitting elements and a packaging material. The circuit substrate includes a first surface, a second surface opposite the first surface, and multiple through slots penetrating through the first and second surfaces. The through slots each are in a stepped form, and the circuit substrate is divided into a chip mounting area, multiple anodes, and a common cathode. The light-emitting elements include multiple light-emitting elements mounted on the circuit substrate along a straight line and electrically connected with the anodes respectively through wires. The packaging material covers the circuit substrate, the light-emitting elements and the wires. The display device has an excellent performance while achieving a small size.

13 Claims, 7 Drawing Sheets

(51) Int. Cl.
*H01L 21/48* (2006.01)
*H01L 21/683* (2006.01)
*H01L 25/075* (2006.01)
*H01L 33/56* (2010.01)

(56) References Cited

U.S. PATENT DOCUMENTS

| | | | |
|---|---|---|---|
| 2012/0181678 A1* | 7/2012 | Groenhuis | H01L 21/4825 |
| | | | 257/676 |
| 2015/0235578 A1* | 8/2015 | Lee | G09F 9/33 |
| | | | 40/541 |
| 2019/0006326 A1* | 1/2019 | Jiang | H01L 25/167 |
| 2019/0279558 A1* | 9/2019 | Monestier | B60R 1/00 |
| 2019/0355294 A1* | 11/2019 | Gu | G09G 3/3426 |
| 2021/0083152 A1* | 3/2021 | Biebersdorf | H01L 25/0753 |
| 2021/0166618 A1* | 6/2021 | Baumheinrich | G09G 3/32 |

\* cited by examiner

DISPLAY DEVICE AND MANUFACTURING METHOD THEREOF

TECHNICAL FIELD

The disclosure relates to the field of display technologies, and more particularly to a display device and a manufacturing method thereof.

DESCRIPTION OF RELATED ART

With the development of display technologies, people have a higher pursuit for display effect of display screens, and also put forward the requirements of smaller size and better color degree for LED devices. However, product miniaturization of chip-type devices in the existing technology has a great resistance. In particular, on the one hand, resulting from the chip-type devices being firstly molded on a large BT plate and then cut into individual devices by a cutter, when the cutting size is smaller, soldering spots of the device are closer to edges thereof, which will easily affect the soldering performance. On the other hand, more space for cutting needs to be reserved in the manufacturing process, thus reducing spaces for die bonding and wiring, and it is difficult to realize the miniaturization of product.

SUMMARY

Accordingly, embodiments of the disclosure provide a display device and a manufacturing method thereof, which can ensure the display device to have good performance while realizing a small size of the display device.

In an aspect, an embodiment of the disclosure provides a display device including a circuit substrate, multiple (i.e., more than one) light-emitting elements and a packaging material. The circuit substrate includes a first surface, a second surface opposite to the first surface, and multiple through slots penetrating through the first surface and the second surface. The through slots each are stepped in form. The through slots divide the circuit substrate into a chip mounting region, a first anode, a second anode, a third anode and a common cathode. The multiple light-emitting elements include a first light-emitting element, a second light-emitting element and a third light-emitting element mounted in the chip mounting region and sequentially arranged along a straight line. The first light-emitting element, the second light-emitting element and the third light-emitting element are electrically connected to the first anode, the second anode and the third anode respectively by bonding wires. The packaging material is disposed covering the circuit substrate, the multiple light-emitting elements and the bonding wires.

In an embodiment, each of the through slots has a size of an opening exposed to the first surface is larger than that of an opening exposed to the second surface.

In an embodiment, the first light-emitting element, the second light-emitting element and the third light-emitting element are mounted on the second surface.

In an embodiment, the first light-emitting element, the second light-emitting element and the third light-emitting element are a red LED (light-emitting diode), a green LED and a blue LED respectively.

In an embodiment, each of the through slots has a step surface between the first surface and the second surface, the step surface is parallel to the first surface and second surface, a distance between the step surface and the first surface is less than 0.05 mm, and a distance between the first surface and the second surface is less than 0.15 mm.

In an embodiment, the display device has a length in a range of 0.5 mm to 0.7 mm, a width in a range of 0.5 mm to 0.7 mm, and a height in a range of 0.5 mm to 0.6 mm; a spacing between the first anode and the second anode is greater than twice a length of the first anode, and a spacing between the first anode and the common cathode is greater than the length of the first anode and less than twice a width of the first anode.

In an embodiment, the chip mounting area is connected with the common cathode.

In an embodiment, the first anode and the common cathode are located on a side of the chip mounting region, and the second anode and the third anode are located on another opposite side of the chip mounting region.

In an embodiment, the packaging material includes a resin matrix and a plurality of nanoscale matte particles dispersed in the resin matrix.

In another aspect, an embodiment of the disclosure provides a manufacturing method of the display device as described above, including steps of:

providing a conductive base;

etching the conductive base to form a conductive circuit and then cutting the conductive base to obtain a conductive frame, wherein the conductive frame includes multiple interconnected circuit substrates, each of the circuit substrates includes a first surface, a second surface opposite to the first surface, and multiple through slots penetrating through the first surface and second surface; the through slots are stepped in form, each of the through slots has a size of an opening exposed at the first surface is greater than that of an opening exposed at the second surface; and the through slots divide the circuit substrate into a chip mounting region, a first anode, a second anode, a third anode and a common cathode;

attaching an impermeable tape onto the first surface;

mounting multiple light-emitting elements in the chip mounting region at the second surface, wherein the multiple light-emitting elements include a first light-emitting element, a second light-emitting element and a third light-emitting element are sequentially arranged along a straight line and further electrically connected with the first anode, the second anode and the third anode respectively through wires;

encapsulating each the circuit substrate, the plurality of light-emitting elements and the wires by a packaging material, wherein the packaging material includes a resin matrix and a plurality of nanoscale matte particles dispersed in the resin matrix;

punching the conductive frame to separate the circuit substrates from one another; and removing the impermeable tape.

Sum up, the display devices or the display device manufactured in the above technical solution have good performance while achieving small size, for example, may have the following advantages or beneficial effects.

Firstly, the through slot is a stepped slot structure with the step surface, and the stepped slot structure have three advantages of: (1) lengthening the path of moisture infiltration and thereby improving the anti-moisture ability of the device, (2) increasing distances among bottom soldering pads and thereby preventing the occurrence of tin short circuit phenomenon, and (3) increasing operation area of the functional region for die bonding and wiring and thus being helpful to enhance the packaging quality of the device.

Secondly, the multiple light-emitting elements are arranged along a straight line (also referred to as stripe arrangement) to better match in light distribution, which can overcome the defect of light-emitting elements arranged in delta manner in the prior art and ensure that color inconsistency will not occur when viewing a display on the left and right.

Thirdly, the design of the common cathode is more energy efficient than that of the common anode, and compared by experiments, it can save 30% energy.

Fourthly, the circuit substrate directly sinks to the bottom, reducing the heat conduction path and greatly improving heat dissipation ability of the display device.

Fifthly, the packaging material is dispersed with nanoscale matte particles, which has two advantages that: (1) when an external light strikes thereon, the display device will rarely reflect the incident light, effectively improving contrast of the display; and (2) the nanoscale matte particles can improve the connection strength between the packaging material and the circuit substrate, and further can improve moisture resistance of the display device.

Sixthly, compared with the prior art, the display device according to the disclosure has a relatively simple material composition, which reduces the stress effect between different materials and helps improving the product quality.

BRIEF DESCRIPTION OF THE DRAWINGS

In order to more clearly illustrate technical solutions of embodiments of the disclosure, drawings used in the description of the embodiments will be briefly described below. Apparently, the drawings described below are merely some embodiments of the disclosure, and those skilled in the art can obtain other drawings based on these drawings without creative efforts.

DETAILED DESCRIPTION OF EMBODIMENTS

The technical solutions in the embodiments of the disclosure will be clearly and completely described below, with reference to the accompanying drawings in the embodiments of the disclosure. Apparently, the described embodiments are merely some of the embodiments of the disclosure, not all embodiments. Based on the described embodiments of the disclosure, all the other embodiments obtained by those skilled in the art without any creativity should belong to the protective scope of the disclosure.

First Embodiment

Figure 1:
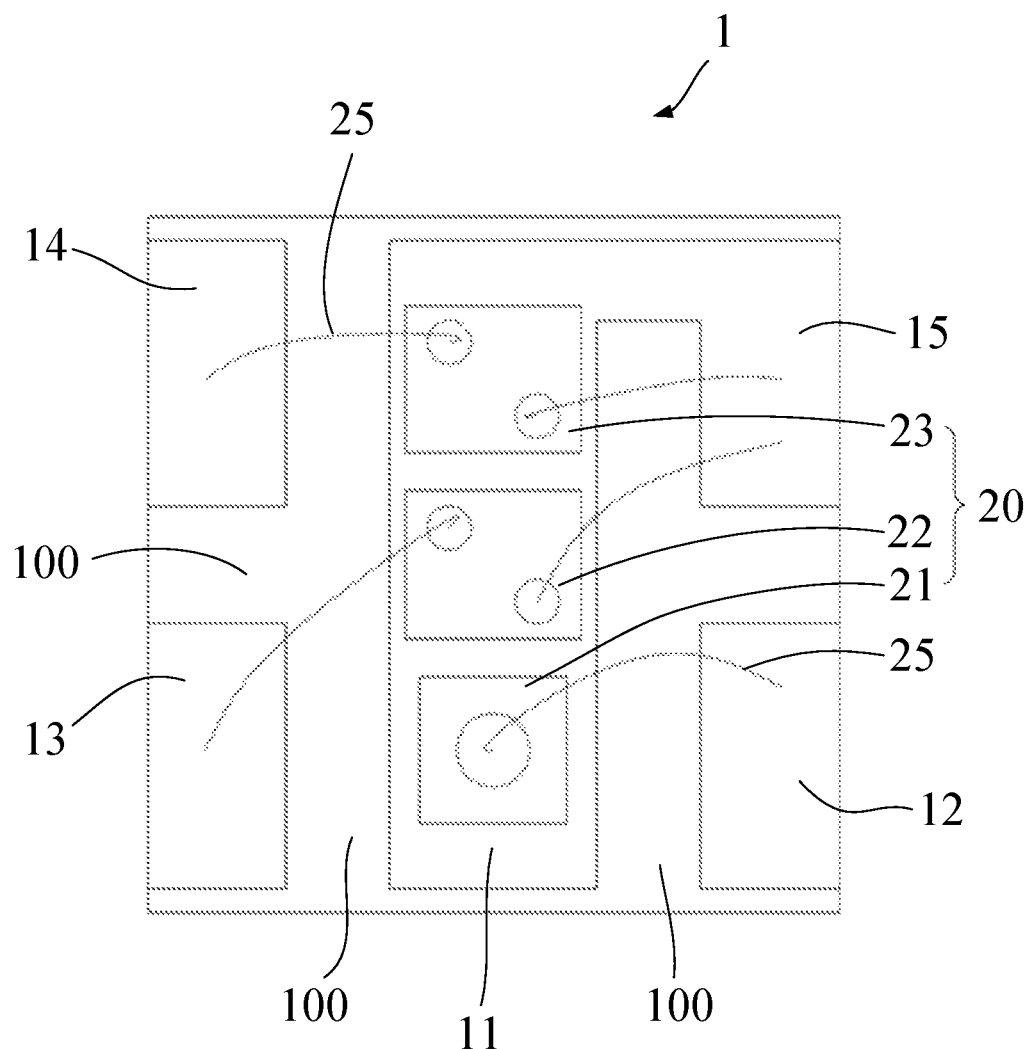
FIG. 1 is a schematic structural view of a display device according to a first embodiment of the disclosure.
Figure 2:
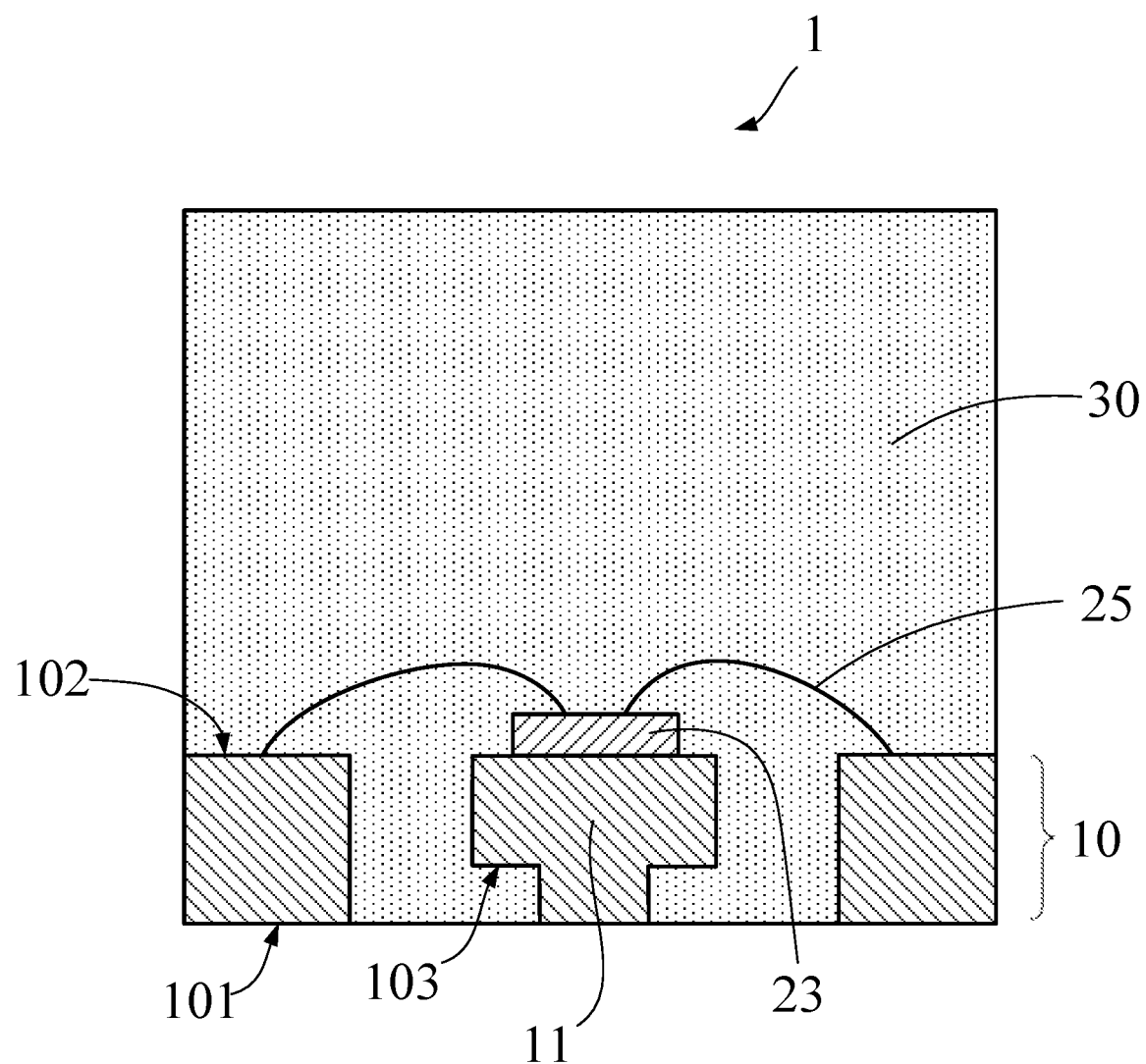
FIG. 2 is a schematic sectional structural view of the display device according to the first embodiment of the disclosure.
Figure 3:
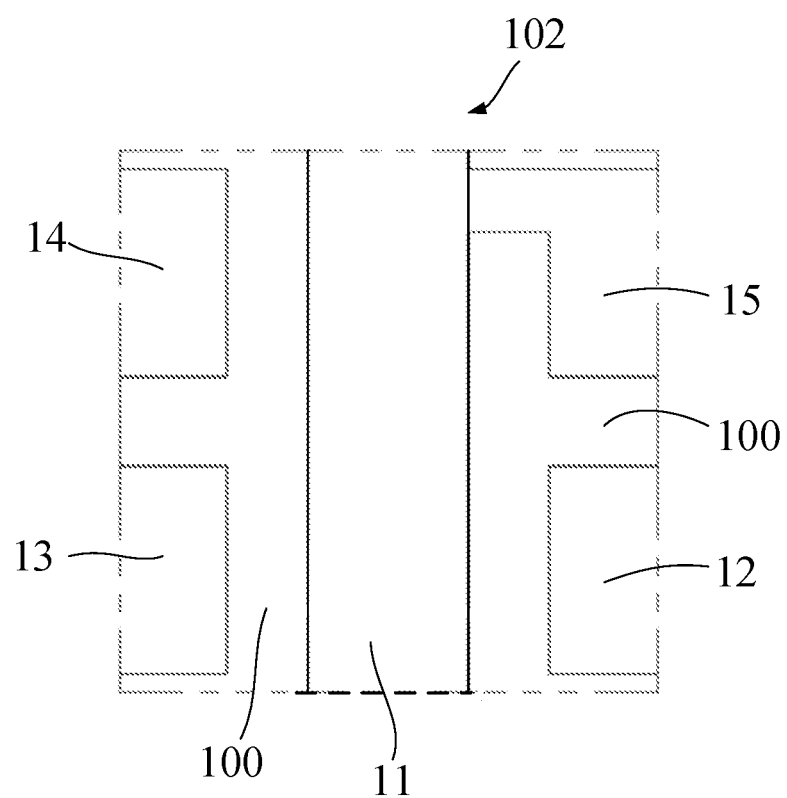
FIG. 3 is a schematic view of a second surface of a conductive base of the display device according to the first embodiment of the disclosure.
Figure 4:
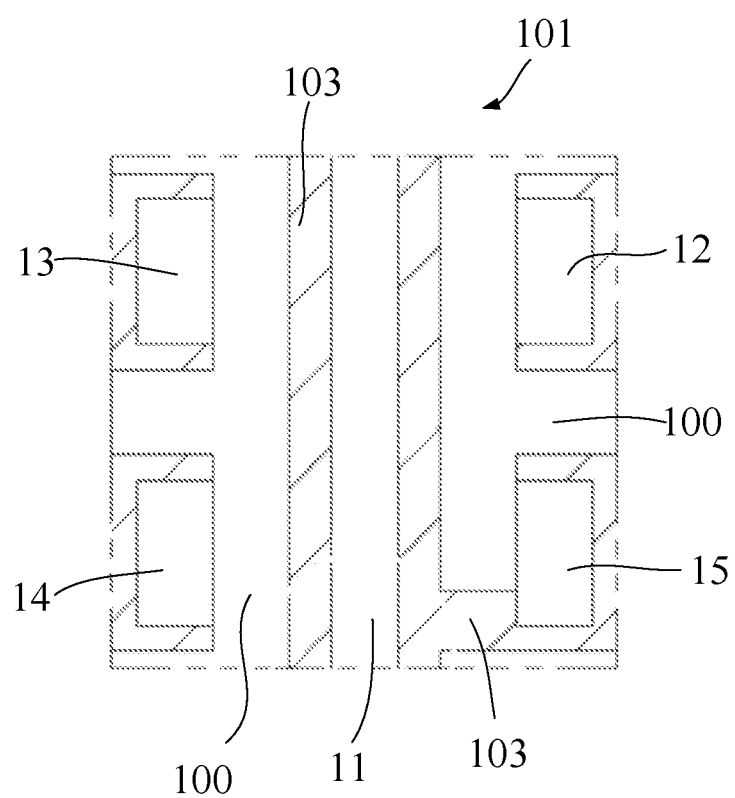
FIG. 4 is a schematic view of a first surface of the conductive base of the display device according to the first embodiment of the disclosure.

As shown in FIGS. 1-4, a first embodiment of the disclosure provides a display device 1 including: a circuit substrate 10, a plurality of light-emitting elements 20 and a packaging material 30.

The circuit substrate 10 includes a first surface 101, a second surface 102 opposed to the first surface 101, and a plurality of through slots 100 penetrating through the first surface 101 and the second surface 102. The through slots 100 each have a size of an opening exposed on the first surface 101 is larger than that of an opening exposed on the second surface 102. Specifically, the through slots 100 each are in a stepped form, that is, a stepped slot, and have a step surface 103 located between the first surface 101 and the second surface 102 (in FIG. 4, the step surface 103 is specially indicated with oblique lines). The step surface 103 is parallel to the first surface 101 as well as the second surface 102. A distance between the step surface 103 and the first surface 101 is less than 0.05 mm, for example, it may be 0.043 mm A distance between the first surface 101 and the second surface 102 is less than 0.15 mm, i.e. a thickness of the circuit substrate 10 is less than 0.15 mm, for example, it may be 0.127 mm. The circuit substrate 10 may be rectangular, and its length and width are in a range of 0.5 mm to 0.7 mm, for example, 0.6 mm.

The through slots 100 divide the circuit substrate 10 into multiple regions. The multiple regions include a chip mounting region 11, a first anode 12, a second anode 13, a third anode 14 and a common cathode 15. The chip mounting area 11 is located in a middle of the circuit substrate 10 and connected with the common cathode 15. The first anode 12 and the common cathode 15 are located on one side of the chip mounting region 11, and the second anode 13 and the third anode 14 are located on the other side of the chip mounting region 11. That is, the first anode 12 and the second anode 13 are respectively located on opposite sides of the chip mounting region 11. The third anode 14 and the common cathode 15 are also respectively located on the opposite sides of the chip mounting region 11. Sizes of the first anode 12, the second anode 13 and the third anode 14 may be the same. A spacing between the first anode 12 and the second anode 13 is generally greater than twice a width of the first anode 12, and also greater than twice a length of the first anode 12. For example, when a size of the first anode 12 is 0.12 mm*0.17 mm, the spacing between the first anode 12 and the second anode 13 may be greater than 0.34 mm, for example, 0.36 mm A spacing between the first anode 12 and the common cathode 15 is generally greater than a length of the first anode 12 and less than twice a width of the first anode 12. For example, when a size of the first anode 12 is 0.12 mm*0.17 mm, the spacing between the first anode 12 and the common cathode 15 may be 0.22 mm. The above listed data is only an example of production design, and in a specific production manufacturing process, the product size can be designed based on a specific situation.

The light-emitting elements 20 include first light-emitting element 21, a second light-emitting element 22 and a third light-emitting element 23 sequentially arranged along a straight line. The first light-emitting element 21, the second light-emitting element 22 and the third light-emitting element 23 are mounted 23 in the chip mounting region 11 and located at the second surface 102. Moreover, the first light-emitting element 21, the second light-emitting element 22 and the third light-emitting element 23 respectively are electrically connected to the first anode 12, the second anode 13 and the third anode 14 through respective bonding wires 25. The first light-emitting element 21, the second light-emitting element 22 and the third light-emitting element 23 for example are a red LED, a green LED and a blue LED respectively. Of course, it is understood that the green light LED and the blue light LED are further connected with the common cathode 15 by bonding wires 25, the red light LED may be further electrically connected with the common cathode 15, and the electrical connection manner is not limited, for example, may be connected through pins. The bonding wires 25 each are for example a gold wire.

The packaging material 30 is disposed covering the circuit substrate 10, the multiple light-emitting elements 20 mounted on the circuit substrate 10 and the bonding wires 25. The packaging material 30 is a mixed material and includes a resin matrix and a plurality of nanoscale matte particles evenly dispersed in the resin matrix. The resin substrate, for example is epoxy resin, silicone, etc., and the nanoscale matter particles may be insulating particles with a transmittance less than 95%. Due to sufficient interfaces between the nanoscale particles and the resin matrix, paths of incident light can be increased and a reflectivity of the mixed material can be reduced. The reflectivity of the mixed material is, for example, less than 20%. A height of the package material 30 is less than 0.45 mm, such as 0.4 mm.

An overall size of the display device 1 is small, a length thereof is in a range of 0.5 mm to 0.7 mm, a width thereof is in a range of 0.5 mm to 0.7 mm, and a height thereof is in a range of 0.5 mm to 0.6 mm. For example, the size of display device 1 is 0.6 mm*0.6 mm*0.527 mm.

The display device 1 according to the disclosure may have the following advantages.

Firstly, the through slot 100 is a stepped slot structure with the step surface 103, and the stepped slot structure have three advantages of: (1) lengthening the path of moisture infiltration and thereby improving the anti-moisture ability of the device, (2) increasing distances among bottom soldering pads and thereby preventing the occurrence of tin short circuit phenomenon, and (3) increasing operation area of the functional region for die bonding and wiring and thus being helpful to enhance the packaging quality of the device.

Secondly, the multiple light-emitting elements 20 are arranged in a straight line (also referred to as stripe arrangement) to better match in light distribution, which can overcome the defect of light-emitting elements arranged in delta manner in the prior art and ensure that color inconsistency will not occur when viewing the display on the left and right.

Thirdly, the design of the common cathode is more energy efficient than that of the common anode, and compared by experiments, it can save 30% energy.

Fourthly, the circuit substrate 10 directly sinks to the bottom, reducing the heat conduction path and greatly improving heat dissipation ability of the display device 1.

Fifthly, the packaging material 30 is dispersed with nanoscale matte particles, which has two advantages that: (1) when an external light strikes thereon, the display device 1 will rarely reflect the incident light, effectively improving contrast of display; and (2) the nanoscale matte particles can improve the connection strength between the packaging material 30 and the circuit substrate, and further can improve moisture resistance of the display device 1.

Sixthly, compared with the prior art, the display device 1 has a relatively simple material composition, which reduces the stress effect between different materials and helps improving the product quality.

As mentioned above, the display device 1 according to the disclosure has simple structure and excellent performance while achieving small size.

Second Embodiment

Figure 5:
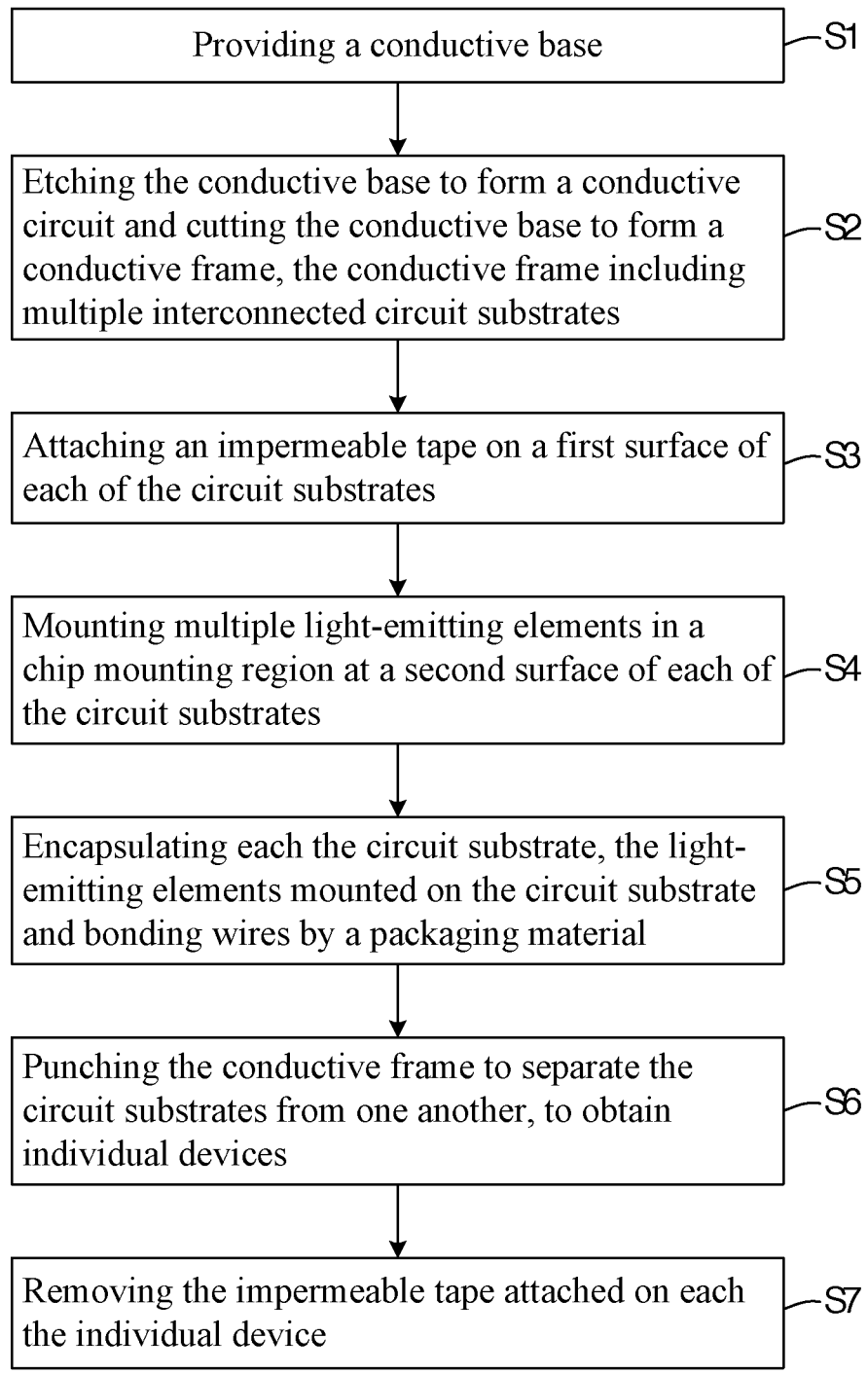
FIG. 5 is a flowchart of a manufacturing method of a display device according to a second embodiment of the disclosure.
Figure 6:
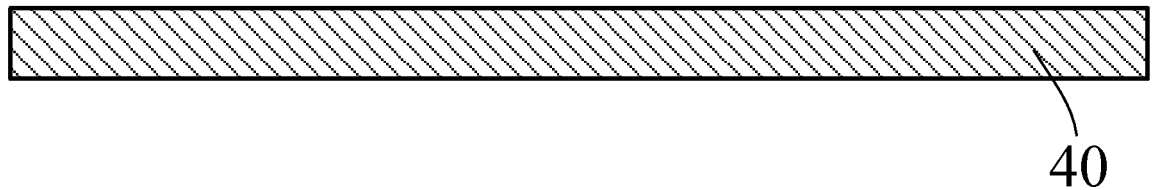
FIG. 6 is a schematic sectional structural view of a conductive base according to the second embodiment of the disclosure.
Figure 7:
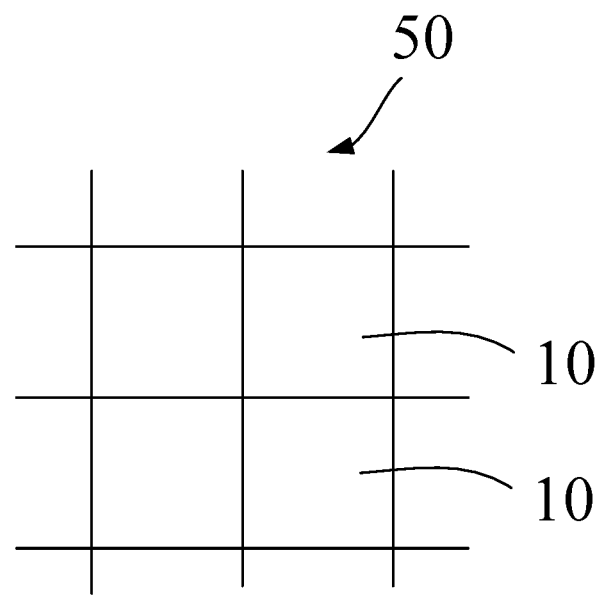
FIG. 7 is a schematic view of a plane structure of a conductive frame according to the second embodiment of the disclosure.
Figure 8:
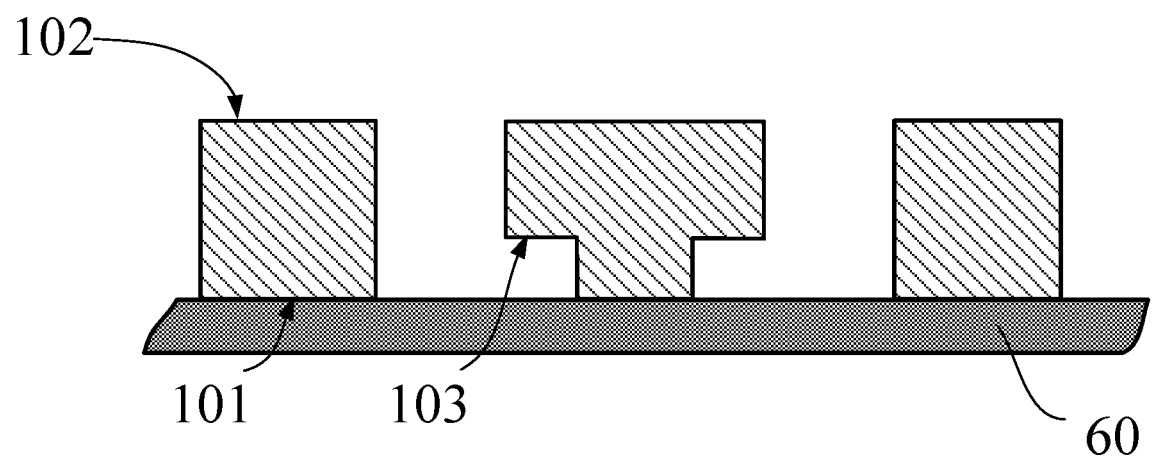
FIG. 8 is a schematic sectional structural view of a first surface of a circuit substrate attached with an impermeable tape according to the second embodiment of the disclosure.

Referring to FIGS. 5-8, a second embodiment of the disclosure provides a manufacturing method of the display device 1 as shown in FIGS. 1-4. The manufacturing method includes the following steps S1-S7.

S1, providing a conductive base 40, such as a copper foil.

S2, etching the conductive base 40 to form a conductive circuit and cutting the conductive base 40 to form a conductive frame 50. In particular, the conductive frame 50 includes a plurality of interconnected circuit substrate 10. It is understood that a size of the conductive frame 50 is less than the size of the conductive base 40, for example, the size of the conductive frame 50 is 140 mm*70 mm. The structure of each circuit substrate 10 is described above and is not repeated here.

S3, attaching an impermeable tape 60 onto the first surface 101 of each circuit substrate 10.

S4, installing a plurality of light-emitting elements 20 in the chip mounting area 11 of the second surface 102 of each circuit substrate 10. In particular, the plurality of luminescent elements 20 includes the first light-emitting element 21, the second light-emitting element 22 and the third light-emitting element 23 arranged along a straight line. The plurality of light-emitting elements are electrically connected to respective anodes through bonding wires 25.

S5, encapsulating each circuit substrate 10, the plurality of light-emitting elements 20 mounted on the circuit substrate 10 and the bonding wires 25 by the packaging material 30 by means of a molding machine. The packaging material 30 includes a resin matrix and nanoscale matte particles.

S6, punching the conductive frame 50 to separate the plurality of circuit substrates 10 to thereby obtain individual devices.

S7, removing the impermeable tape 60 attached onto each of the individual devices to obtain the display device.

The advantages of the obtained display device are as described above, such as simple structure, excellent performance, moisture-proof, short-circuit proof and anti-reflection proof.

Finally, it should be noted that the foregoing description merely illustrates some embodiments of the disclosure, and is not intended to limit the scope of the disclosure. Although the disclosure has been disclosed in the above embodiments, it is not intended to limit the disclosure. Any person skilled in the art can make some amendments or modifications as equivalent embodiments according to the above disclosed technical contents without departing from the technical scope of the disclosure. As long as they are without departing from the technical scope of the disclosure, any simple amendments, equivalent changes and modifications to the above embodiments according to the technical essence of the disclosure are still within the technical scope of the disclosure.

What is claimed is:
1. A display device, comprising:
   a circuit substrate, comprising a first surface, a second surface opposite to the first surface, and a plurality of stepped through slots penetrating through the first surface and the second surface; wherein the through slots divide the circuit substrate into a chip mounting region, a first anode, a second anode, a third anode and a common cathode;

a plurality of light-emitting elements, comprising a first light-emitting element, a second light-emitting element and a third light-emitting element mounted in the chip mounting region and sequentially arranged along a straight line; wherein the first light-emitting element, the second light-emitting element and the third light-emitting element are electrically connected to the first anode, the second anode and the third anode respectively by bonding wires; and a packaging material, disposed covering the circuit substrate, the plurality of light-emitting elements and the bonding wires;

wherein a spacing between the first anode and the second anode is greater than twice a length of the first anode, and a spacing between the first anode and the common cathode is greater than the length of the first anode and less than twice a width of the first anode;

wherein the display device has a length in a range of 0.5 mm to 0.7 mm, a width in a range of 0.5 mm to 0.7 mm, and a height in a range of 0.5 mm to 0.6 mm.

2. The display device as claimed in claim 1, wherein each of the through slots has a size of an opening exposed to the first surface is larger than that of an opening exposed to the second surface.

3. The display device as claimed in claim 2, wherein the first light-emitting element, the second light-emitting element and the third light-emitting element are mounted on the second surface.

4. The display device as claimed in claim 3, wherein the first light-emitting element, the second light-emitting element and the third light-emitting element are a red LED, a green LED and a blue LED respectively.

5. The display device as claimed in claim 2, wherein each of the through slots has a step surface between the first surface and the second surface, the step surface is parallel to the first surface and second surface, a distance between the step surface and the first surface is less than 0.05 mm, and a distance between the first surface and the second surface is less than 0.15 mm.

6. The display device as claimed in claim 1, wherein the chip mounting region is connected with the common cathode.

7. The display device as claimed in claim 6, wherein the first anode and the common cathode are located on a side of the chip mounting region, and the second anode and the third anode are located on another opposite side of the chip mounting region.

8. The display device as claimed in claim 1, wherein the packaging material comprises a resin matrix and a plurality of nanoscale matte particles dispersed in the resin matrix.

9. A manufacturing method adapted for the display device as claim in claim 1, comprising:

providing a conductive base;

etching the conductive base to form a conductive circuit and then cutting the conductive base to obtain a conductive frame, wherein the conductive frame comprises a plurality of interconnected circuit substrates, each of the circuit substrates comprises a first surface, a second surface opposite to the first surface, and a plurality of stepped through slots penetrating through the first surface and second surface; each of the through slots has a size of an opening exposed at the first surface is greater than that of an opening exposed at the second surface; and the through slots divide the circuit substrate into a chip mounting region, a first anode, a second anode, a third anode and a common cathode;

attaching an impermeable tape onto the first surface;

mounting a plurality of light-emitting elements in the chip mounting region at the second surface, wherein the plurality of light-emitting elements comprise a first light-emitting element, a second light-emitting element and a third light-emitting element are sequentially arranged along a straight line and further electrically connected with the first anode, the second anode and the third anode respectively through wires;

encapsulating each the circuit substrate, the plurality of light-emitting elements and the wires by a packaging material, wherein the packaging material comprises a resin matrix and a plurality of nanoscale matte particles dispersed in the resin matrix;

punching the conductive frame to separate the circuit substrates from one another; and removing the impermeable tape.

10. A display device, comprising:

a circuit substrate, comprising a first surface, a second surface opposite to the first surface, and a plurality of stepped through slots penetrating through the first surface and the second surface; wherein the through slots divide the circuit substrate into a chip mounting region, a first anode, a second anode, a third anode and a common cathode;

a plurality of light-emitting elements, comprising a first light-emitting element, a second light-emitting element and a third light-emitting element mounted in the chip mounting region and sequentially arranged along a straight line; wherein the first light-emitting element, the second light-emitting element and the third light-emitting element are electrically connected to the first anode, the second anode and the third anode respectively by bonding wires; and a packaging material, disposed covering the circuit substrate, the plurality of light-emitting elements and the bonding wires;

wherein the first anode, the second anode, the third anode and the common cathode are spaced from one another by the stepped through slots; and the first anode, the second anode and the third anode are individually spaced from the chip mounting region by the stepped through slots;

wherein the first anode and the common cathode are located at one side of the chip mounting region, while the second anode and the third anode are located at another opposite side of the chip mounting region;

wherein the display device has a length in a range of 0.5 mm to 0.7 mm, a width in a range of 0.5 mm to 0.7 mm, and a height in a range of 0.5 mm to 0.6 mm.

11. The display device as claimed in claim 10, wherein the common cathode is connected with the chip mounting region.

12. The display device as claimed in claim 11, wherein the first light-emitting element, the second light-emitting element and the third light-emitting element are different colors of light-emitting diodes (LEDs) and electrically connected to the same common cathode; and some of the first light-emitting element, the second light-emitting element and the third light-emitting element are electrically connected to the common cathode by bonding wires.

13. The display device as claimed in claim 10, wherein a spacing between the first anode and the second anode is greater than twice a length of the first anode, and a spacing between the first anode and the common cathode is greater than the length of the first anode and less than twice a width of the first anode.

* * * * *